United States Patent
Jang

(10) Patent No.: US 11,195,800 B2
(45) Date of Patent: Dec. 7, 2021

(54) ELECTRONIC DEVICE MODULE AND METHOD OF MANUFACTURING THE SAME

(71) Applicant: SAMSUNG ELECTRO-MECHANICS CO., LTD., Suwon-si (KR)

(72) Inventor: Jung Mok Jang, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 0 days.

(21) Appl. No.: 16/423,803

(22) Filed: May 28, 2019

(65) Prior Publication Data
US 2020/0286839 A1    Sep. 10, 2020

(30) Foreign Application Priority Data
Mar. 6, 2019    (KR) .................... 10-2019-0025948

(51) Int. Cl.
*H01L 23/552*    (2006.01)
*H01L 21/48*    (2006.01)
*H01L 23/367*    (2006.01)

(52) U.S. Cl.
CPC ........ *H01L 23/552* (2013.01); *H01L 21/4875* (2013.01); *H01L 23/367* (2013.01)

(58) Field of Classification Search
CPC . H01L 23/552; H01L 21/4875; H01L 23/367; H01L 25/0655; H01L 2924/19105; H01L 2224/73253; H01L 2224/16225; H01L 2224/83194; H01L 23/5383; H01L 23/3675; H01L 23/42; H01L 25/16; H01L 21/50; H01L 23/60; H01L 23/31; H01L 23/04

See application file for complete search history.

(56) References Cited

U.S. PATENT DOCUMENTS

| | | | | |
|---|---|---|---|---|
| 6,392,888 | B1* | 5/2002 | Chen et al. | ................... 367/704 |
| 7,254,032 | B1* | 8/2007 | Xue | .................... H01L 23/3675 |
| | | | | 257/707 |
| 9,935,075 | B2* | 4/2018 | Huang | .................. H01L 23/552 |
| 2001/0004313 | A1* | 6/2001 | Yamaoka | ............. H01L 23/4093 |
| | | | | 361/704 |
| 2004/0231872 | A1* | 11/2004 | Arnold | .............. H01L 23/49838 |
| | | | | 174/377 |
| 2007/0090502 | A1* | 4/2007 | Zhao | .................. H01L 23/3128 |
| | | | | 257/675 |

(Continued)

FOREIGN PATENT DOCUMENTS

| JP | 4630449 B2 | 2/2011 |
|---|---|---|
| KR | 10-20130077178 A | 7/2013 |
| KR | 10-1920972 B1 | 11/2018 |

*Primary Examiner* — Marcos D. Pizarro
*Assistant Examiner* — Sue Tang
(74) *Attorney, Agent, or Firm* — NSIP Law

(57) ABSTRACT

An electronic device module includes a substrate, a first device and a second device mounted on the substrate, and a shielding frame mounted on the substrate to accommodate the first device. The shielding frame includes a heat dissipating portion stacked on the first device, and posts extended from an edge of the heat dissipating portion and spaced apart from each other. A spacing distance between the posts is smaller than a wavelength of an electromagnetic wave introduced into the first device or output from the first device.

25 Claims, 8 Drawing Sheets

(56) References Cited

U.S. PATENT DOCUMENTS

| | | | |
|---|---|---|---|
| 2008/0099891 A1* | 5/2008 | Kato | H01L 23/4334 |
| | | | 257/666 |
| 2012/0241967 A1* | 9/2012 | Kim | H01L 25/105 |
| | | | 257/773 |
| 2016/0227680 A1* | 8/2016 | Hyun | C23C 18/1653 |
| 2017/0287825 A1* | 10/2017 | Lee | H01L 21/56 |
| 2020/0168566 A1* | 5/2020 | Tsai | H01L 21/4867 |

* cited by examiner

ELECTRONIC DEVICE MODULE AND METHOD OF MANUFACTURING THE SAME

CROSS-REFERENCE TO RELATED APPLICATION

This application claims the benefit under 35 USC 119(a) of Korean Patent Application No. 10-2019-0025948 filed on Mar. 6, 2019 in the Korean Intellectual Property Office, the entire disclosure of which is incorporated herein by reference for all purposes.

BACKGROUND

1. Field

The following description relates to an electronic device module and a method of manufacturing the same.

2. Description of Background

In semiconductor devices, as chip sizes have been reduced and the number of input/output terminals has been increased due to miniaturization in process technology and diversification of functions, the pitch of electrode pads has been getting smaller and fusion of various functions has been accelerated. Thus, a packaging technique of integrating a plurality of devices in a single package is required.

To control an increase in product prices with such a technique improvement requirement, a stacked semiconductor package in which a plurality of electronic devices is stacked and a system-in-package (SIP) type electronic device module in which electronic devices having different functions are integrated are being manufactured.

In such an electronic device module, since electronic devices are disposed adjacent to each other therein, an electric signal may be distorted due to noise occurring between the electronic devices, or peripheral devices are damaged due to a heating device generating a large amount of heat during operating.

SUMMARY

This Summary is provided to introduce a selection of concepts in simplified form that are further described below in the Detailed Description. This Summary is not intended to identify key features or essential features of the claimed subject matter, nor is it intended to be used as an aid in determining the scope of the claimed subject matter.

Examples provide an electronic device module capable of effectively dissipating heat while blocking noise occurring between electronic devices, and a method of manufacturing the electronic device module.

In one general aspect, an electronic device module includes a substrate, a first device and a second device mounted on the substrate, and a shielding frame mounted on the substrate to accommodate the first device. The shielding frame includes a heat dissipating portion stacked on the first device, and posts extended from an edge of the heat dissipating portion and spaced apart from each other. A spacing distance between the posts is smaller than a wavelength of an electromagnetic wave introduced into the first device or output from the first device.

The electronic device module may include a sealing portion disposed on the substrate to seal the first electronic device, the second electronic device, and the shielding frame.

The heat dissipating portion may include an upper surface exposed externally of the sealing portion.

The electronic device module may include a heat dissipating member disposed on an upper portion of the heat dissipating portion and including an upper surface exposed externally of the sealing portion.

The heat dissipating member may have a block shape or a through-via shape.

The electronic device module may include a shielding layer disposed along a surface of the sealing portion and electrically connected to a ground of the substrate through the shielding frame.

The sealing portion may fill an inner space of the shielding frame.

The electronic device module may include a heat transfer layer disposed between the first device and the heat dissipating portion.

The heat dissipating portion may include an accommodating portion formed as a groove in a lower surface of the heat dissipating portion, and at least a portion of the first device may be disposed in the accommodating portion.

The posts may each have an end inserted into a respective insertion hole disposed in the substrate.

The heat dissipating portion and the posts may each have a same thickness.

A surface of the shielding frame may include a coupling layer having a surface roughness increased by a surface treatment.

In another general aspect, a method of manufacturing an electronic device module includes forming a heat dissipating portion and a plurality of posts by removing portions of a metal plate, forming a shielding frame by bending portions of the metal plate at which the heat dissipating portion and the plurality of posts are connected, and mounting the shielding frame on a substrate such that a first device mounted on the substrate is accommodated in the shielding frame.

A spacing distance between the posts may be smaller than a wavelength of an electromagnetic wave introduced into the first device or output from the first device.

The method may include disposing a heat transfer layer on an upper surface of the first device, prior to mounting the shielding frame on the substrate.

The method may include, after forming the shielding frame, forming a coupling layer having increased roughness on a surface of the shielding frame.

In another general aspect, an electronic device module includes a substrate; a first device mounted on the substrate to input and/or output an electromagnetic wave having a certain wavelength; a heat dissipating portion to dissipate heat generated by the first device; and columns extending between the heat dissipating portion and the substrate to surround a periphery of the first device. A distance between adjacent columns is smaller than the certain wavelength.

The heat dissipating portion may be in surface contact with a surface of the first device.

The electronic device module may include a heat transfer layer disposed between the heat dissipating portion and a surface of the first device.

The heat dissipating portion may include an accommodating groove in a surface adjacent to the surface of the first device, and the heat transfer layer may be disposed in the accommodating groove.

The electronic device module may include a heat dissipating member disposed on a surface of the heat dissipating portion opposite a surface of the of the heat dissipating portion adjacent to the heat transfer layer.

The electronic device module may include a shielding layer disposed on the heat dissipating member and electrically connected to a ground pattern of the substrate.

The heat dissipating portion may be integral with the columns and a thickness of the heat dissipating portion may be equal to a thickness of each of the columns.

A thickness of the heat dissipating portion may be greater than a thickness of each of the columns.

The substrate may include insertion holes, each of the columns may include an insertion portion inserted into a respective insertion hole, and a cross-sectional area of each of the insertion portions may be smaller than a cross-sectional area of a remainder of each of the columns.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
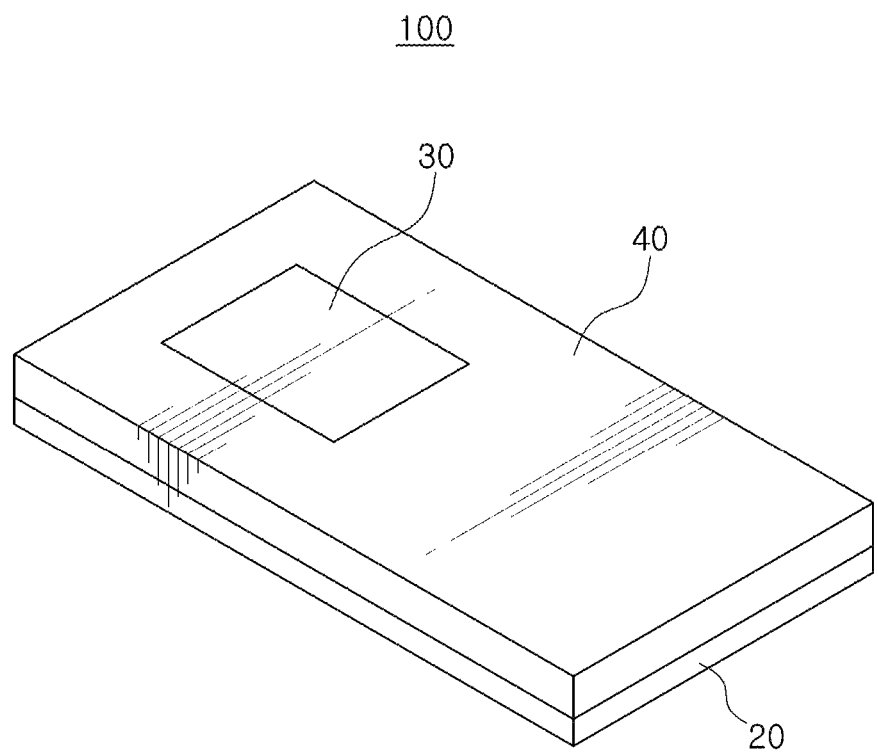
FIG. 1 is a perspective view schematically illustrating an electronic device module according to an example.

The following detailed description is provided to assist the reader in gaining a comprehensive understanding of the methods, apparatuses, and/or systems described herein. However, various changes, modifications, and equivalents of the methods, apparatuses, and/or systems described herein will be apparent to one of ordinary skill in the art. The sequences of operations described herein are merely examples, and are not limited to those set forth herein, but may be changed as will be apparent to one of ordinary skill in the art, with the exception of operations necessarily occurring in a certain order. Also, descriptions of functions and constructions that would be well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will fully convey the scope of the disclosure to one of ordinary skill in the art.

Herein, it is noted that use of the term "may" with respect to an example or embodiment, e.g., as to what an example or embodiment may include or implement, means that at least one example or embodiment exists in which such a feature is included or implemented while all examples and embodiments are not limited thereto.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

In the drawings, the same components are denoted by the same reference symbols. Further, the detailed description of known functions and configurations that may obscure the gist of the present disclosure will be omitted. The drawings may not be to scale, and the relative size, proportions, and depiction of elements in the drawings may be exaggerated for clarity, illustration, and convenience.

It is to be noted that the expressions such as the upper side, the lower side, the side surface, and the like herein are described based on the illustration of the drawings, and may be expressed differently when the direction of a relevant object is changed.

Figure 2:
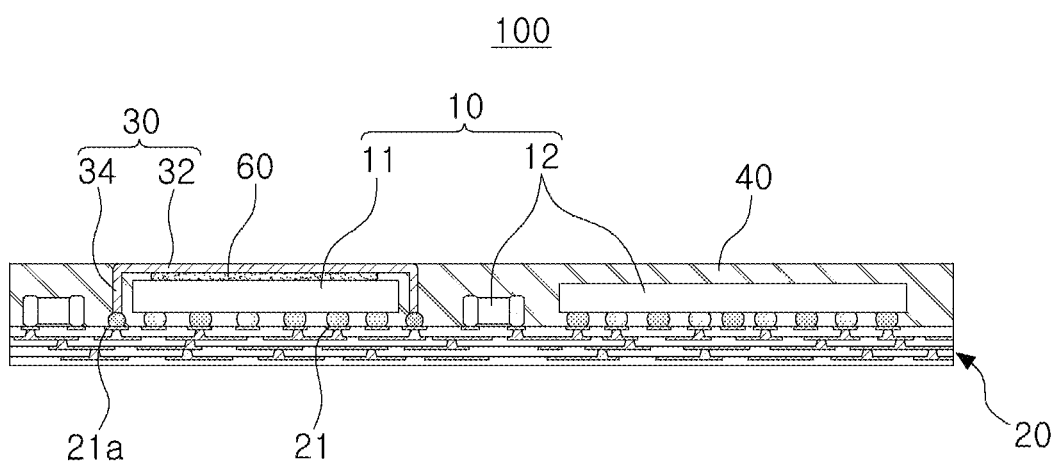
FIG. 2 is a cross-sectional view of the electronic device module illustrated in FIG. 1.
Figure 3:
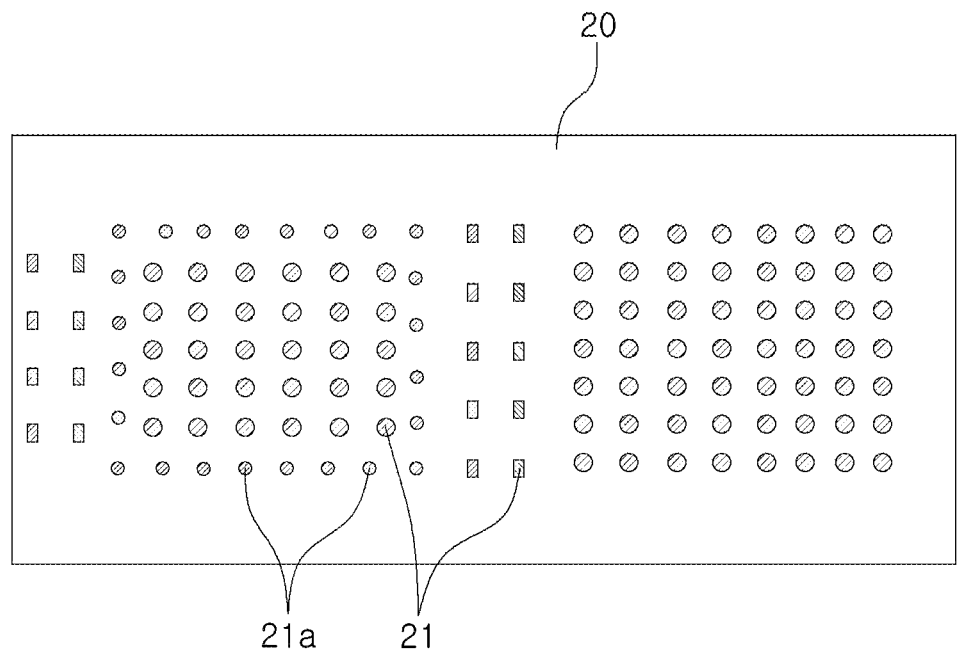
FIG. 3 is a plan view of a substrate illustrated in FIG. 2.
Figure 4:
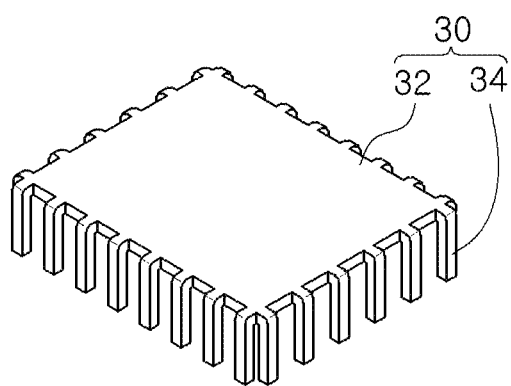
FIG. 4 is a perspective view of a shielding frame illustrated in FIG. 2.

FIG. 1 is a perspective view schematically illustrating an electronic device module according to an example, FIG. 2 is a sectional view of the electronic device module illustrated in FIG. 1, FIG. 3 is a plan view of a substrate illustrated in FIG. 2, and FIG. 4 is a perspective view of a shielding frame illustrated in FIG. 2.

Referring to FIGS. 1 to 4, an electronic device module 100 according to an example may include a substrate 20, a plurality of electronic devices 10, a shielding frame 30, and a sealing portion 40.

The substrate 20 is configured in such a manner that at least one electronic device 10 is mounted on one surface thereof. As the substrate 20, a variety of substrates, such as a printed circuit board (PCB), a flexible substrate, a ceramic substrate, a glass substrate, or the like may be used.

Mounting electrodes 21 for mounting of electronic devices 10, and a wiring pattern (not illustrated) electrically connecting the mounting electrodes 21, are disposed on the substrate 20.

The mounting electrodes 21 of the substrate 20 may include at least one ground electrode 21a. The ground electrode 21a may be formed by exposing a wiring and a pad of a ground property formed on the substrate 20. The ground electrode 21a may be electrically connected to the shielding frame 30. The ground electrode 21a, which is electrically connected to the shielding frame 30, may be disposed in the form of a dashed line along a position in which posts of the shielding frame 30 bonded to the substrate 20 are disposed. However, an example thereof is not limited thereto.

The substrate 20 may be a multilayer substrate formed of a plurality of layers, and a circuit pattern may be formed between respective layers to form an electrical connection.

The electronic device 10 is mounted on one surface of the substrate 20. The electronic device 10 includes various devices such as an active device and a passive device, and any electronic device that may be mounted on the substrate 20 may be used as the electronic device 10.

The electronic device 10 may also be divided into a first device 11 disposed within the shielding frame 30 and a second device 12 disposed externally of the shielding frame 30.

The first device 11 may be comprised of an active element, and may also include a passive element. The first device 11 may include a heat generating element in which a lot of heat is generated during operation, and may include an element that is to be protected from electromagnetic waves emitted externally or from electromagnetic waves during operation.

The second device 12 may include at least one active element or passive element. The second device 12 may also include a device that electromagnetically interferes with the first device 11.

The shielding frame 30 accommodates at least one electronic device 10 in an internal space thereof and is mounted on the substrate 20.

The shielding frame 30 may be composed of a plurality of posts 34 and a heat dissipating portion 32 disposed on the posts 34.

One side of each of the posts 34 is bonded to the substrate 20 to serve as a column for supporting the heat dissipating portion 32, such that the posts 34 are disposed between the heat dissipating portion 32 and the substrate 20.

The posts 34 are disposed along the periphery of the first device 11, and the posts 34 may be spaced apart from each other at regular intervals.

In the example, a spacing between two adjacent posts 34 is configured to be equal to or lower than a threshold. In this case, the threshold is a value determined based on a wavelength of the electromagnetic wave, and indicates a maximum distance at which the movement of the electromagnetic wave may be blocked. In this case, the movement of the electromagnetic wave indicates the movement of electromagnetic wave from the outside of the shielding frame 30 to the inside of the shielding frame 30 or the movement thereof from the inside of the shielding frame to the outside of the shielding frame 30.

For example, in the case of a frequency band of 30 to 300 GHz, the wavelength is 10 mm to 1 mm. Therefore, the spacing between the posts 34 to block the movement of the electromagnetic wave should be 10 mm to 1 mm or less by the Faraday cage principle. In this example, to block the electromagnetic wave more, the posts 34 are configured to have an interval of 1/20 of the wavelength, for example, 0.5 mm to 0.05 mm.

In this example, the intervals between the posts 34 are the same as each other, but the configuration is not limited thereto. For example, the intervals may be configured at different intervals within a range in which the flow of electromagnetic waves may be blocked.

The heat dissipating portion 32 is configured in the form of a roof supported by the posts 34. The heat dissipating portion 32 is formed in a flat plate shape and disposed on upper portions of the posts 34.

The posts 34 are formed to extend from an edge of the heat dissipating portion 32, and a plurality of the posts 34 are uniformly distributed over the edge of the heat dissipating portion 32 as a whole.

Therefore, when the heat dissipating portion 32 has a quadrangular shape, the posts 34 are also disposed in a quadrilateral shape, and when the heat dissipating portion 32 is circular, the posts 34 are also disposed in a circular shape.

However, an example of the present disclosure is not limited thereto, and the posts 34 may be disposed inside the edge of the heat dissipating portion 32.

An upper surface of the heat dissipating portion 32 is exposed externally of the sealing portion 40, and a lower surface of the heat dissipating portion 32 is disposed to be in surface contact with an upper surface of the first device 11.

Therefore, heat transferred from the first device 11 to the heat dissipating portion 32 may be quickly discharged externally through the upper surface of the heat dissipating portion 32.

Although this example illustrates that the entire upper surface of the heat dissipating portion 32 is exposed externally of the sealing portion 40 by way of example, an example thereof is not limited thereto. For example, the entire upper surface of the heat dissipating portion 32 may be only partially exposed.

The shielding frame 30 of the example is manufactured by processing and bending a single metal plate. Accordingly, the heat dissipating portion 32 and the posts 34 may be integrally formed and formed to have the same thickness. However, an example thereof is not limited thereto.

In this example, only one shielding frame 30 is provided in the electronic device module 100 by way of example, but an example thereof is not limited thereto. For example, the electronic device module 100 may be configured to include a plurality of shielding frames 30.

The shielding frame 30 may be bonded to the ground electrode 21a provided on the substrate 20. The shielding frame 30 and the ground electrode 21a may be bonded to each other via a conductive adhesive such as solder or a conductive resin.

The shielding frame 30 having such a structure is formed of a material having relatively high thermal conductivity and capable of shielding electromagnetic waves. For example, as the material of the shielding frame 30, stainless steel, or an alloy of copper, zinc, and nickel may be used. However, an example thereof is not limited to such materials.

A heat transfer layer 60 may be disposed between the electronic device 10 (for example, first device 11) and the heat dissipating portion 32 to increase the thermal conductivity. The heat transfer layer 60 may be disposed in such a manner that one surface thereof contacts the upper surface of the first device 11 and the other surface thereof contacts the lower surface of the heat dissipating portion 32.

The heat transfer layer 60 may be formed using a conductive adhesive or a resin adhesive, and a material having relatively high thermal conductivity may be used. For example, the heat transfer layer 60 may be formed of a conductive adhesive containing silver (Ag), or may be formed of an epoxy resin-based resin adhesive.

A thermal interface material (TIM) may also be used as a material of the heat transfer layer 60 as needed. As the TIM, a liquid type such as paste or grease, a sheet type, or a pad type formed of silicon or the like may be selectively used.

The sealing portion 40 is disposed on a first surface of the substrate 20 to seal the electronic device 10 and the shielding frame 30. The sealing portion 40 is fixed in the form of surrounding the electronic device 10 to safely protect the electronic device 10 from external impact.

The sealing portion 40 according to the example may be introduced into the inside of the shielding frame 30 through a space between the posts 34 in a manufacturing process. Thus, the sealing portion 40 may also fill the space formed between the shielding frame 30 and the first device 11.

The sealing portion 40 is formed of an insulating material. For example, the sealing portion 40 may be formed of a resin material such as an epoxy molding compound (EMC), but a material thereof is not limited thereto. The sealing portion 40 may also be formed of a conductive material, for example, a conductive resin or the like, as necessary. In this case, a separate sealing member such as an underfill resin may be provided between the electronic device 10 and the substrate 20.

In the case of the electronic device module 100 according to the example described above, although the plurality of electronic devices 10 are mounted on one substrate 20, interference between the electronic devices 10 may be blocked by the shielding frame 30.

Also, the shielding frame 30 according to the example is used as a heat transfer path, discharging heat generated from the electronic devices 10, externally. Therefore, heat generated in the first device 11 may be rapidly discharged externally of the electronic device module.

Next, a method of manufacturing an electronic device module illustrated in FIG. 2 will be described.

First, a method of manufacturing the shielding frame 30 will be described.

Figure 5:
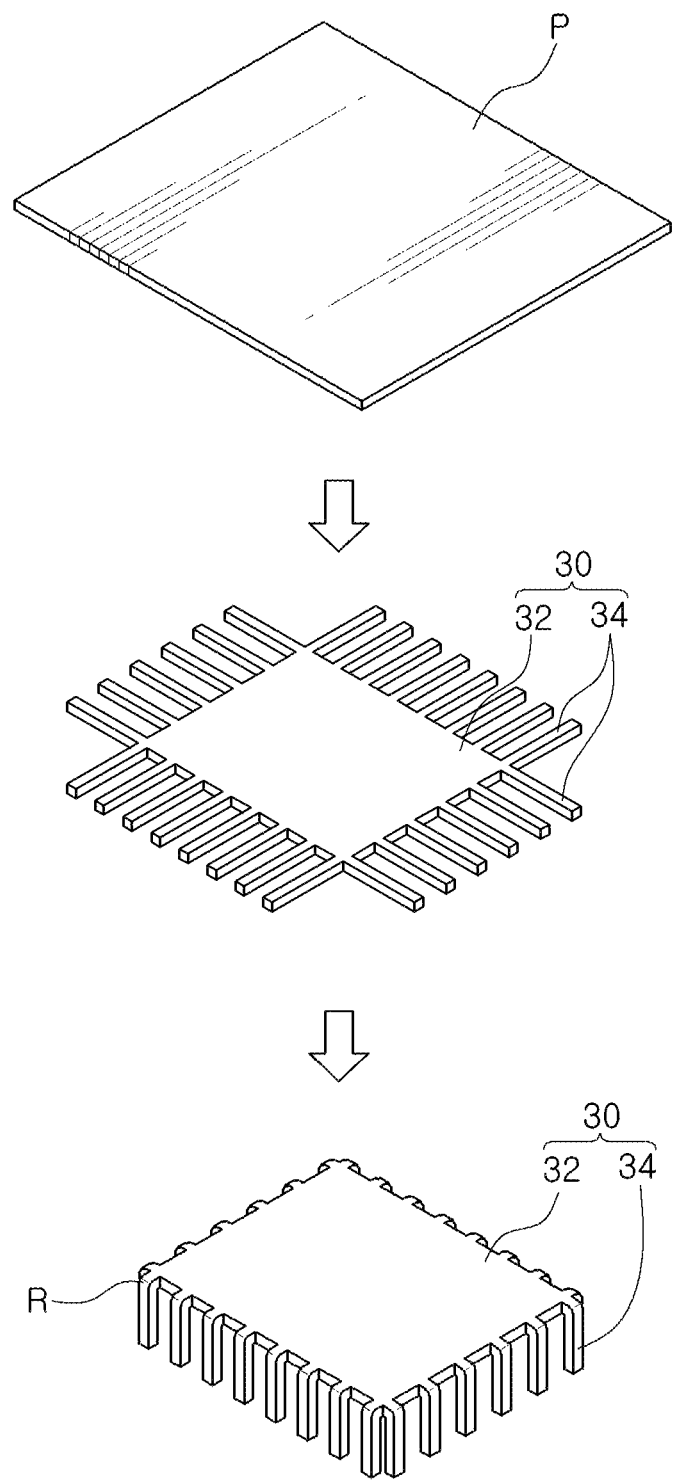
FIG. 5 is a view illustrating a method of manufacturing the shielding frame illustrated in FIG. 2.

FIG. 5 is a view illustrating a method of manufacturing the shielding frame illustrated in FIG. 2.

Referring to FIG. 5, in a method of manufacturing the shielding frame according to the example, first a metal plate P is prepared.

The metal plate P may be a copper plate, but a material thereof is not limited thereto.

Subsequently, only regions used for a heat dissipating portion 32 and posts 34 are left and the remaining unnecessary portions are removed, through etching or pressing.

The metal plate P is comprised of the heat dissipating portion 32 and a plurality of the posts 34 extending outwardly around the heat dissipating portion 32.

Then, portions of the posts 34 and the heat dissipating portion 32, connected to each other, are bent to complete a shielding frame 30.

Thus, in this example, the posts 34 and the heat dissipating portion 32 are formed by bending a single metal plate. Accordingly, the heat dissipating portion 32 and the posts 34 are formed to have the same thickness. Since the bending process is performed using a pressing or stamping method, the bending portion to which the posts 34 and the heat dissipating portion 32 are connected may be formed as a curved surface R. However, an example thereof is not limited thereto.

FIGS. 6 to 10 are views illustrating the method of manufacturing the electronic device module illustrated in FIG. 2 in order of process.

Figure 6:
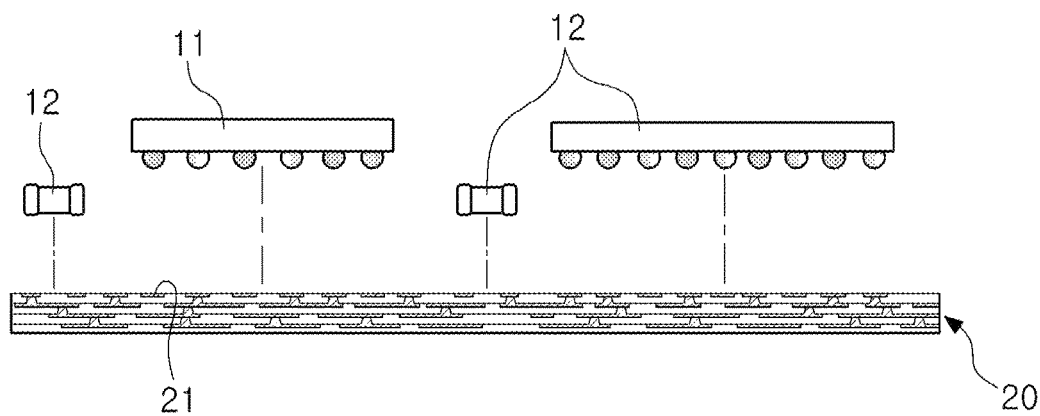
FIGS. 6, 7, 8, 9, and 10 are views illustrating a method of manufacturing the electronic device module illustrated in FIG. 2 in order of process.

First, electronic devices 11 and 12 are mounted on a substrate 20, as illustrated in FIG. 6.

The electronic devices 11 and 12 may be bonded to the substrate 20 through a conductive adhesive such as a solder. For example, after a conductive paste is applied on a mounting electrode 21 and the electronic devices 11 and 12 are placed on the conductive paste, the electronic devices 11 and 12 are subjected to a reflow process, to be mounted on the substrate 20.

Figure 7:
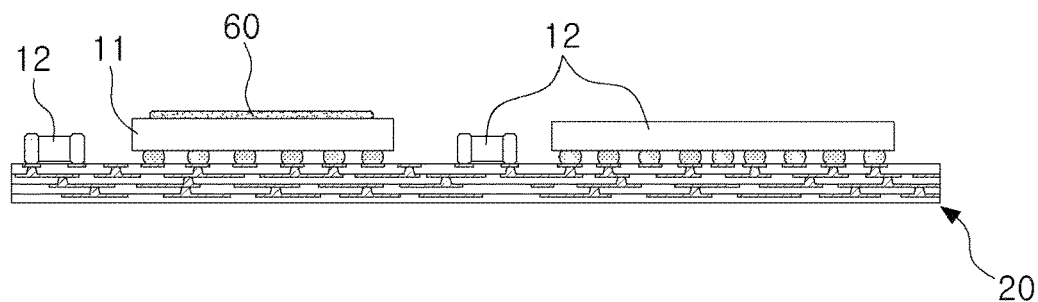
Figure 8:
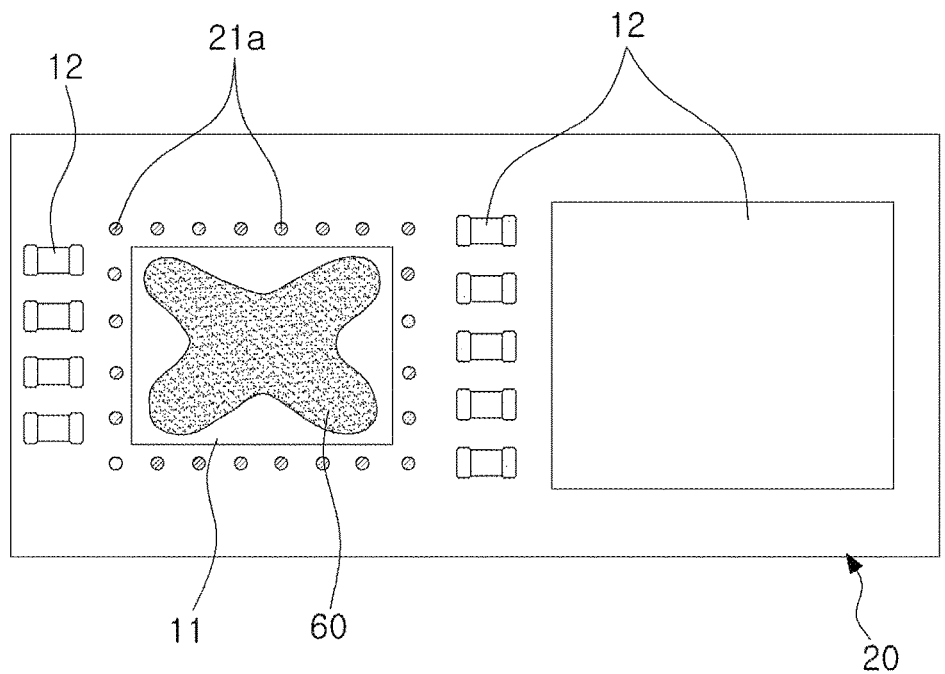

Next, as illustrated in FIGS. 7 and 8, a heat transfer layer 60 is disposed on an upper surface (or an inactive surface) of the first device 11. FIG. 8 is a plan view of FIG. 7.

As described above, the heat transfer layer 60 may be formed by applying a paste or an epoxy resin adhesive containing silver (Ag) to the inactive surface of the first device 11. However, an example thereof is not limited to such materials.

Figure 9:
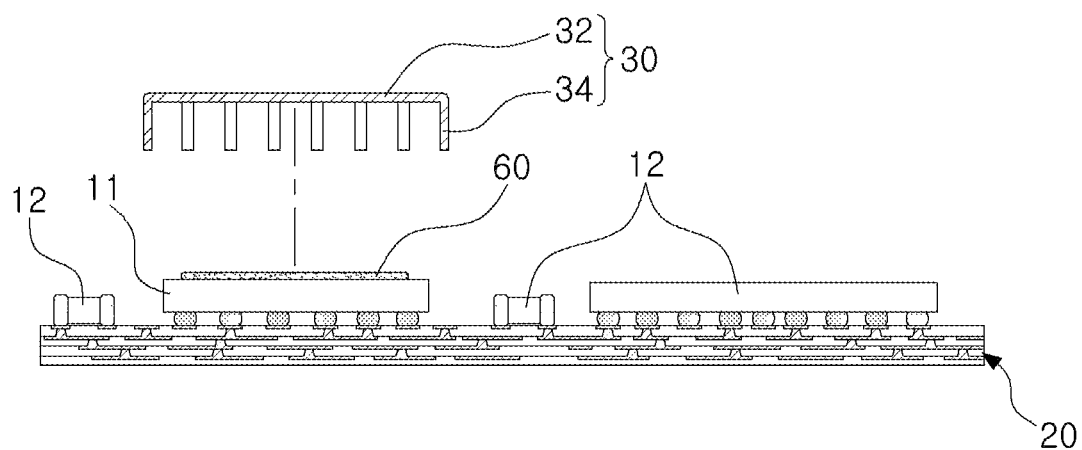
Figure 10:
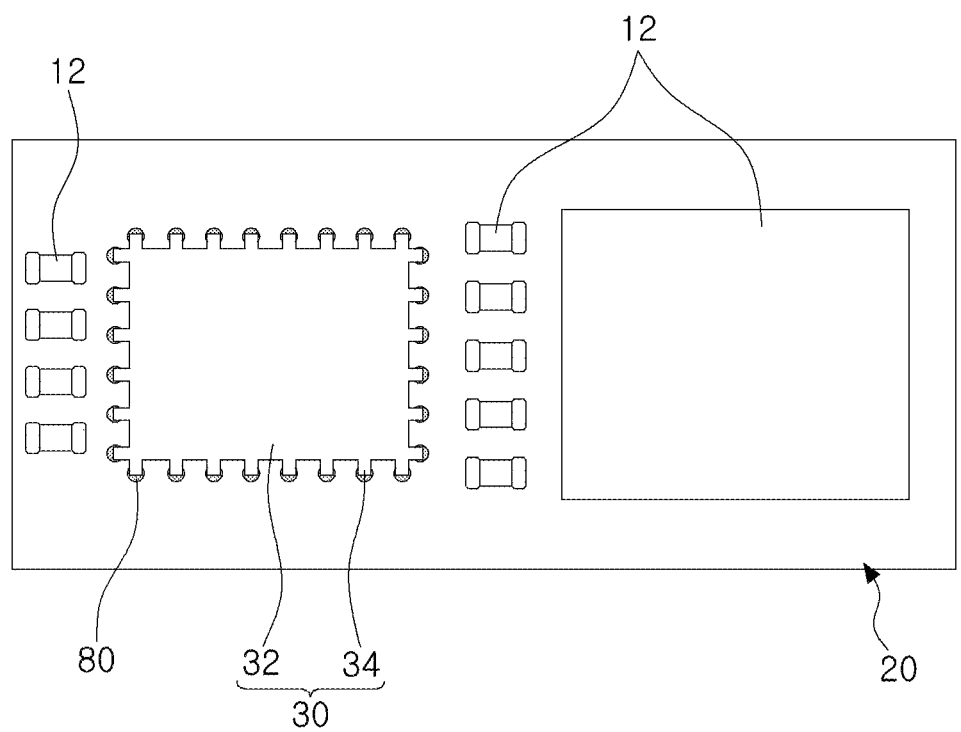

Subsequently, the shielding frame 30 is mounted on the substrate 20 as illustrated in FIGS. 9 and 10. FIG. 10 illustrates a plane in a state in which the shielding frame of FIG. 9 is mounted on the substrate 20.

The shielding frame 30 may be mounted on the substrate 20, through a process of applying an adhesive to a ground electrode 21a, a process of placing the shielding frame 30 on the substrate 20, and a reflowing process and a curing process.

In this case, the adhesive may be a conductive paste or an epoxy-based conductive resin.

During the process of placing the shielding frame 30 on the substrate 20, the heat transfer layer 60 bonds the heat dissipating portion 32 and the first device 11 to each other, while being in contact with a lower surface of the heat dissipating portion 32 of the shielding frame 30. Lower ends of the posts 34 of the shielding frame 30 are bonded to the ground electrode 21a of the substrate 20 via a conductive adhesive 80.

Then, a sealing portion 40 is formed to complete the electronic device module 100 illustrated in FIG. 2.

The sealing portion 40 is formed on one entire surface of the substrate 20, but may also be only partially formed on one surface of the substrate 20.

The sealing portion 40 is formed to embed the electronic devices 10 and the shielding frame 30 together.

As illustrated in FIG. 2, in this example, an upper surface of the shielding frame 30 is exposed externally of the sealing portion 40, which may be implemented by forming a mold such that an upper surface of the shielding frame 30 is exposed in a molding process of forming the sealing portion 40 or by forming the sealing portion 40 on one entire surface of the substrate 20 to completely seal the shielding frame 30, and then removing the sealing portion 40 disposed on the upper portion of the shielding frame 30.

In this operation, the sealing portion 40 may be manufactured through various molding methods including transfer molding and liquid molding. Therefore, a molding resin may also fill the inside of the shielding frame 30 through a space between the posts 34 of the shielding frame 30 in the process of injecting a molding resin, which is the material of the sealing portion 40, into the mold.

In the manufacturing method in the example described above, the shielding frame is formed using the metal plate. Therefore, manufacturing the shielding frame may be facilitated and manufacturing costs may be significantly reduced. Not only the electronic devices disposed externally of the shielding frame, but also the electronic devices disposed inside the shielding frame may be sealed through a single molding process, such that the electronic device module may be manufactured through a minimum process.

An example thereof is not limited to the above-described examples, and various modifications may be applied thereto.

Figure 11:
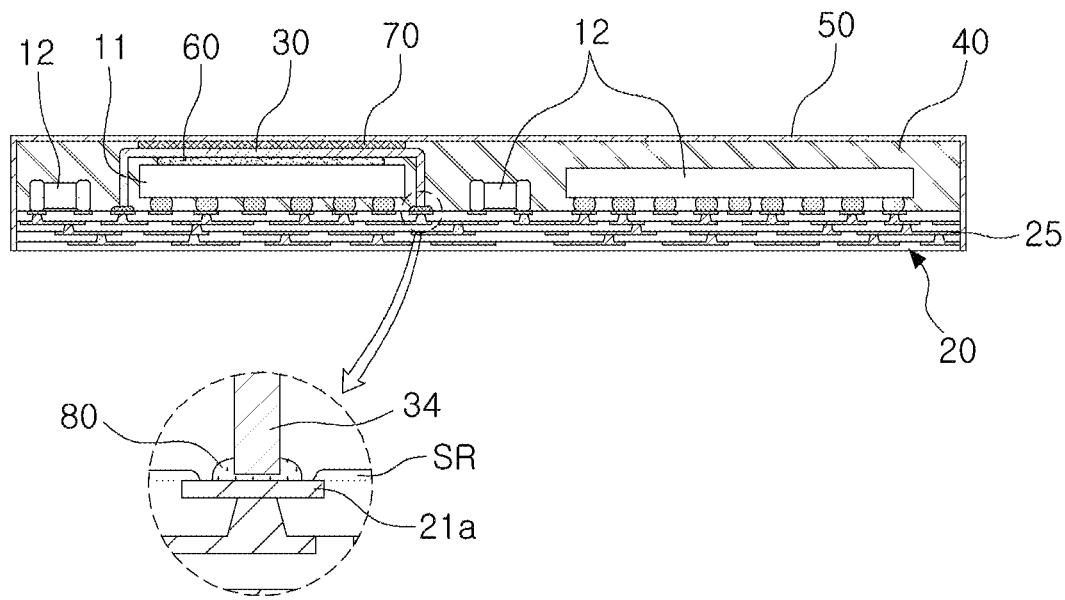
FIG. 11 is a cross-sectional view schematically illustrating an electronic device module according to another example.

FIG. 11 is a cross-sectional view schematically illustrating an electronic device module according to another example.

Referring to FIG. 11, in the case of the electronic device module according to the example, a shielding frame 30 is not exposed externally of the sealing portion 40. A heat dissipating member 70 is disposed on an upper surface of the shielding frame 30.

The heat dissipating member 70 is disposed in a sealing portion 40, and an upper surface thereof is exposed externally of the sealing portion 40. Accordingly, heat generated in a first device 11 is discharged externally of the electronic device module through a heat transfer layer 60, the shielding frame 30, and the heat dissipating member 70.

In this example, the heat dissipating member 70 is formed to have a block shape covering an entire upper surface of the shielding frame 30. However, an example thereof is not limited thereto, and may be modified to have various shapes as necessary.

The heat dissipating member 70 may be formed of a resin or a conductive adhesive having relatively high thermal conductivity, similarly to the case of the heat transfer layer 60, but a material thereof is not limited thereto. For example, the heat dissipating member 70 may be formed of the same material as that of the heat transfer layer 60.

In addition, in the electronic device module of this example, a shielding layer 50 is disposed on a surface of the sealing portion 40.

The shielding layer 50 is disposed along a surface formed by the sealing portion 40, the heat dissipating member 70 and side surfaces of the substrate 20, and is formed by applying a resin material containing conductive powder to the surface. In the case of a metal thin film, the film may be formed through various techniques such as sputtering, spray coating, screen printing, vapor deposition, electrolytic plating, and non-electrolytic plating.

The shielding layer 50 is electrically connected to a ground property of the substrate 20. To this end, the substrate 20 may be provided with at least one ground pattern 25 exposed to a side surface of the substrate 20. The ground pattern 25 may be one of grounding circuit wirings having grounding properties, formed in the substrate 20.

The shielding layer 50 may be physically and electrically connected to the ground pattern 25 exposed on the side of the substrate 20, but an example thereof is not limited thereto. For example, the shielding layer 50 may be electrically connected to a ground of the substrate 20 through the heat dissipating member 70 and the shielding frame 30. In this case, the ground pattern 25 may be omitted.

The configuration including the shielding layer 50 may be applied to the electronic device module illustrated in FIG. 2. In this case, a shielding layer may be disposed on the entirety of side surfaces and an upper surface of the electronic device module. Thus, the shielding layer is also disposed on an upper surface of the shielding frame 30 exposed externally of the sealing portion 40. However, an example thereof is not limited thereto, and various modifications thereof may be performed. For example, the shielding layer may only be formed on a portion of the electronic device module excluding the upper surface of the shielding frame 30.

The substrate 20 according to the example is configured in such a manner that a solder resist (SR), a protective layer, partially covers the pad. However, an example thereof is not limited thereto.

Figure 12:
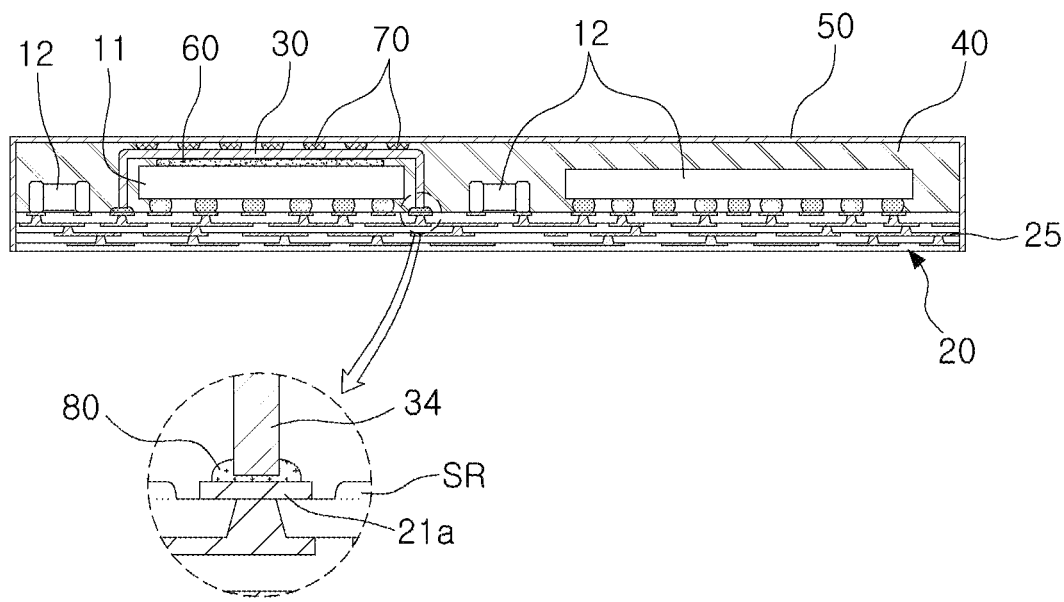
FIG. 12 is a cross-sectional view schematically illustrating an electronic device module according to another example.

FIG. 12 is a cross-sectional view schematically illustrating an electronic device module according to another example.

Referring to FIG. 12, the electronic device module according to the example is configured similarly to the electronic device module illustrated in FIG. 11, and only differs in terms of the shape of a heat dissipating member 70.

The heat dissipating member 70 of this example is formed to have the form of a through via, penetrating through a sealing portion 40, disposed on an upper portion of the shielding frame 30. Therefore, a plurality of the heat dissipating members are disposed to be spaced apart from each other in positions facing the upper surface of the shielding frame 30.

The heat dissipating member 70 may be formed by forming a through hole in the sealing portion 40 by using a laser drill or the like after forming the sealing portion 40 and then filling the through hole with a material having relatively high thermal conductivity. In a manner similar to the foregoing examples, the heat dissipating member 70 according to the example may also be formed of the same material as that of a heat transfer layer 60, but an example thereof is not limited thereto.

A substrate 20 according to the example is a substrate on which a nonsolder mask defined (NSMD)-type pad is formed. The NSMD refers to a method in which a solder resist is disposed not to cover a portion of a pad.

Accordingly, a conductive adhesive 80 bonding a post 34 and a ground electrode 21a to each other may be disposed to be spaced apart from the solder resist SR without contacting therewith.

Figure 13:
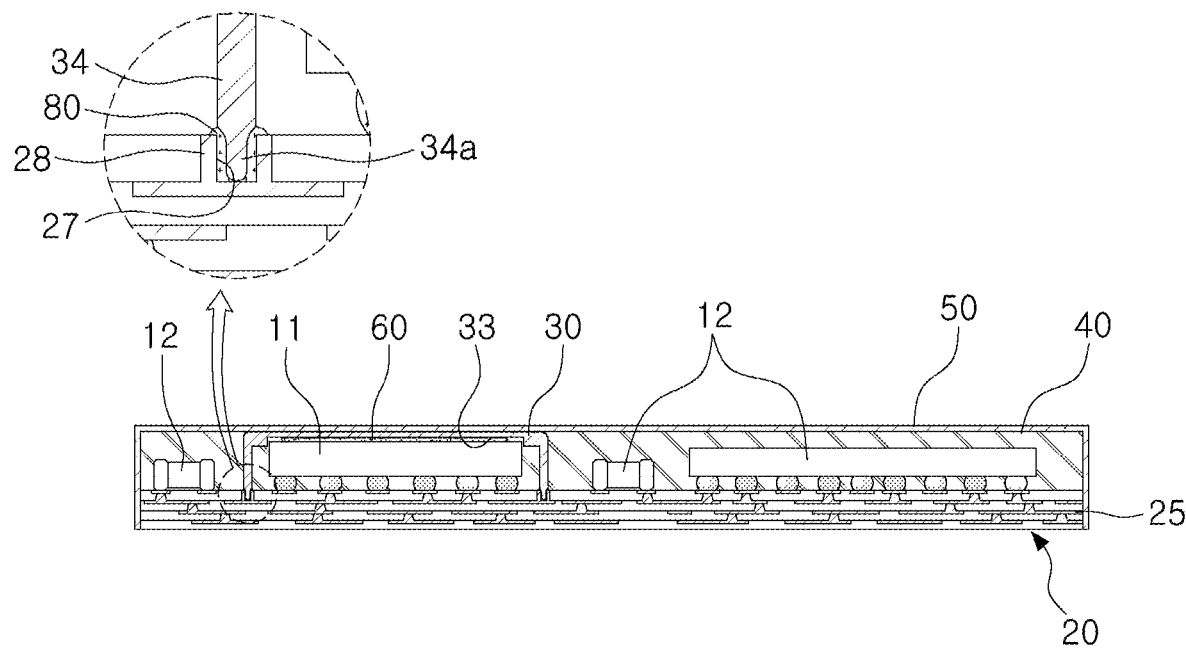
FIG. 13 is a cross-sectional view schematically illustrating an electronic device module according to another example.
Figure 14:
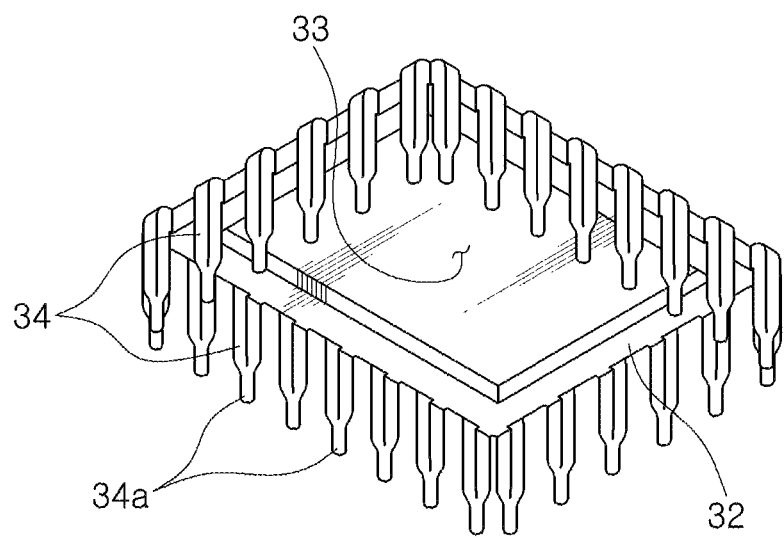
FIG. 14 is a bottom perspective view of a shielding frame illustrated in FIG. 13.
Figure 15:
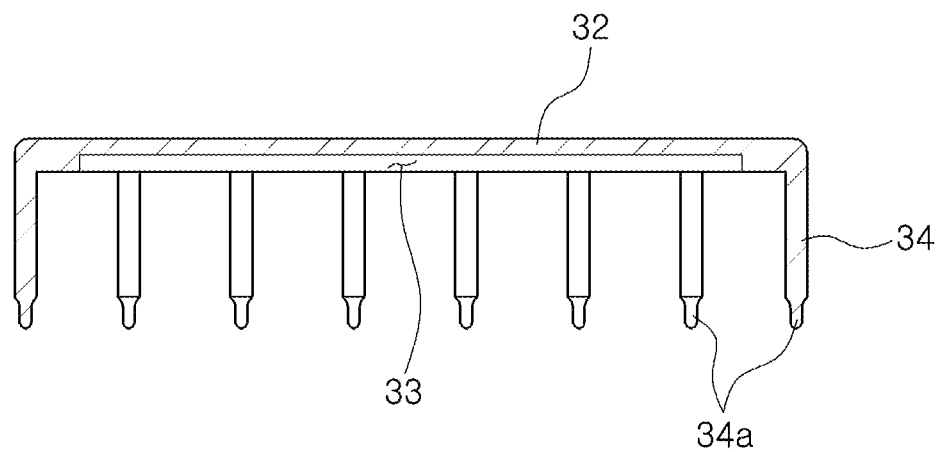
FIG. 15 is a cross-sectional view of the shielding frame illustrated in FIG. 13.

FIG. 13 is a cross-sectional view schematically illustrating an electronic device module according to another example, FIG. 14 is a bottom perspective view of a shielding frame illustrated in FIG. 13, and FIG. 15 is a cross-sectional view of the shielding frame illustrated in FIG. 13.

Referring to FIGS. 13 to 15, in the electronic device module according to the example, an accommodating portion 33 having a groove form is provided in a lower surface of a heat dissipating portion 32 of a shielding frame 30. In the accommodating portion 33, a first device 11 is disposed or a heat transfer layer 60 is disposed to be provided on an upper surface of the first device 11.

Accordingly, in the case of the shielding frame 30, a portion of the heat dissipating portion 32 in which the accommodating portion 33 is formed may have a thickness less than that of the other portions.

As the shielding frame 30 is provided with the accommodating portion 33, the first device 11 disposed inside the shielding frame 30 may have a mounting height increased to correspond to a depth of the accommodating portion 33. In this case, the mounting height indicates a vertical distance from one surface of the substrate 20 on which the electronic device 10 is mounted to an upper end surface of the electronic device 10.

In this case, the first device 11 larger than that in the above-described examples may be included without changing the volume of the electronic device module.

In addition, in a case in which the first device 11 has the same size as that in the foregoing embodiments, the mounting height of the shielding frame 30 may be reduced by a depth corresponding to the depth of the accommodating portion 33. In this case, the thickness of the electronic device module may be reduced.

The accommodating portion 33 may be together formed during a process of forming the posts 34 by processing a metal plate or by performing a separate etching or pressing process thereafter.

In the case of this example, the heat dissipating member 70 (see FIG. 11) of the foregoing example is not included, and the upper surface of the shielding frame 30 is configured to directly contact the shielding layer 50. However, an example thereof is not limited thereto, and the heat dissipating member may also be included in the same manner as in the foregoing examples.

In addition, in this example, portions of lower ends of the posts 34 are inserted into the substrate 20. To this end, respective posts 34 may include an insertion portion 34a having a cross-sectional area less than that of the other portions.

The insertion portion 34a is disposed in lower ends of the posts 34 and may be formed to have a half cross-sectional area as compared with a cross-sectional area of other portions of the posts 34. The insertion portion 34a is inserted into an insertion hole 27 provided in the substrate 20. Therefore, the cross-sectional area of the insertion portion 34a may be defined corresponding to the size, for example, a diameter or the like, of the insertion hole 27 of the substrate 20. A length of the insertion portion 34a may be defined corresponding to a depth of the insertion hole 27.

The insertion portion 34a may be formed together in the process of forming the posts 34 by etching or pressing the metal plate. Also, the insertion hole 27 of the substrate 20 may be formed in the course of manufacturing the substrate 20.

The insertion hole 27 may be formed in a position in which the ground electrodes 21a are disposed in FIG. 2. A metal layer 28 is disposed on an inner wall of the insertion hole 27. Such a structure may be implemented by forming a via hole in one surface of the substrate 20 and then forming the metal layer 28 on the inner wall of the via hole by plating or the like. In this case, the metal layer 28 formed on the inner wall of the via hole may be electrically connected to a grounding property portion of the substrate 20.

The insertion hole 27 of the substrate 20 may be filled with a conductive adhesive 80. Thus, the insertion portion 34a inserted into the insertion hole 27 may be electrically connected to the metal layer 28 of the insertion hole 27 via the conductive adhesive 80.

In the case of the configuration as described above, reliability of electrical and physical connection between the posts 34 of the shielding frame 30 and the substrate 20 may be enhanced. Accordingly, an electronic device module that operates more stably may be provided.

Figure 16:
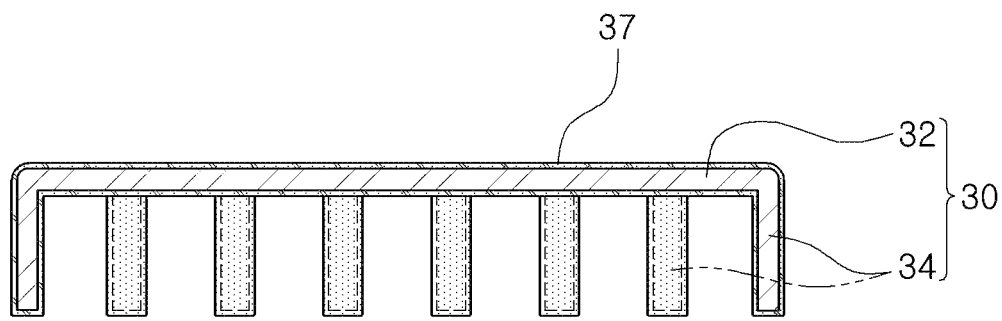
FIG. 16 is a cross-sectional view of a shielding frame according to another example.

FIG. 16 is a cross-sectional view of a shielding frame according to another example.

Referring to FIG. 16, in the case of the electronic device module according to the example, a coupling layer 37 of which surface roughness is increased is formed on a surface of a shielding frame 30.

The coupling layer 37 may be formed by surface-treating the shielding frame 30 formed of a metal material. For example, the coupling layer 37 may be formed of a black oxide film formed through an alkali treatment.

The shielding frame 30 is formed of a metal material, and thus, has a relatively great difference in a coefficient of thermal expansion (CTE) from a CTE of a sealing portion 40 formed of a resin material. Therefore, delamination may occur at an interface between the sealing portion 40 and the shielding frame 30 due to heat generated by the operation of the electronic device module.

However, as in the example of the present disclosure, when the coupling layer 37 is formed on the surface of the shielding frame 30, the coupling layer 37 having increased roughness is combined with the sealing portion 40 (see FIG. 2). In the case of the coupling layer 37 having increased roughness, the surface area is increased up to 200% as compared with a case in which the coupling layer 37 is not present. Therefore, a bonding area with the sealing portion 40 may be greatly expanded, and mechanical coupling force with the sealing portion 40 is also increased due to relatively great roughness.

As a result, the coupling force between the sealing portion 40 and the shielding frame 30 may be increased, and delamination at an interface between the sealing portion 40 and the shielding frame 30 may be significantly reduced.

Figure 17:
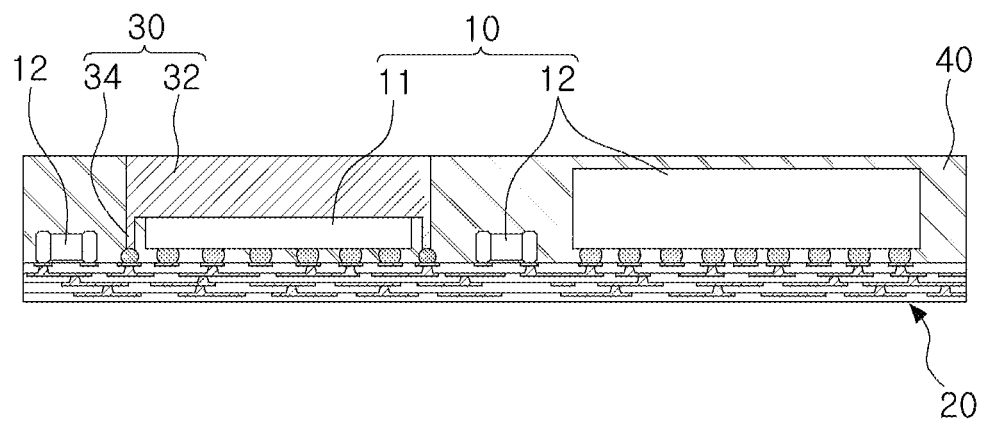
FIG. 17 is a cross-sectional view schematically illustrating an electronic device module according to another example.

FIG. 17 is a cross-sectional view schematically illustrating an electronic device module according to another example.

Referring to FIG. 17, the electronic device module according to the example is configured in such a manner that a thickness of a heat dissipating portion 32 and a thickness of a post 34 of a shielding frame 30 are different from each other.

In this example, the heat dissipating portion 32 is formed in the form of a block to have a thickness greater than a thickness of the post 34.

In the case of the foregoing examples, since the heat dissipating portion 32 is formed to have a relatively reduced thickness, a mounting height of the shielding frame 30 is not great, and thus, in the case of the second devices 12, devices having a relatively low mounting height may only be used.

However, in this example, as the thickness of the heat dissipating portion 32 increases, the mounting height of the shielding frame 30 also increases. As a result, devices having a relatively great mounting height, compared to those in the foregoing examples, may be used as the second device 12.

The shielding frame 30 of the example is formed by bonding the posts 34 to the heat dissipating portion 32 of a block form or by stacking a metal block on the heat dissipating portion 32 of the shielding frame 30. However, an example thereof is not limited thereto.

As set forth above, according to the examples, interference between electronic devices may be prevented through a shielding frame, and a heat dissipation effect may be enhanced through a heat dissipation path provided thereby.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed to have a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. An electronic device module comprising:
   a substrate;
   a first device and a second device mounted on the substrate;
   a shielding frame mounted on the substrate and configured to accommodate the first device;
   a shielding layer mounted on the substrate and configured to accommodate the second device and the shielding frame,
   a heat dissipating member disposed on the shielding frame and in contact with the shielding layer,
   wherein the shielding frame comprises a heat dissipating portion disposed on the first device and posts extended from the heat dissipating portion to the substrate from an edge of the heat dissipating portion and spaced apart from each other, and
   wherein a spacing distance between the posts is smaller than a wavelength of an electromagnetic wave introduced into the first device or output from the first device.

2. The electronic device module of claim 1, further comprising a sealing portion disposed on the substrate and configured to seal the first electronic device, the second electronic device, and the shielding frame.

3. The electronic device module of claim 2, wherein the heat dissipating member comprises an upper surface exposed externally of the sealing portion.

4. The electronic device module of claim 1, wherein the heat dissipating member has a block shape or a through-via shape.

5. The electronic device module of claim 1, wherein the shielding layer is electrically connected to a ground of the substrate through the shielding frame.

6. The electronic device module of claim 2, wherein the sealing portion fills an inner space of the shielding frame.

7. The electronic device module of claim 1, wherein the heat dissipating portion comprises an accommodating portion formed as a groove in a lower surface of the heat dissipating portion, and
   at least a portion of the first device is disposed in the accommodating portion.

8. The electronic device module of claim 1, wherein the posts each have an end inserted into a respective insertion hole disposed in the substrate.

9. The electronic device module of claim 1, wherein the heat dissipating portion and the posts each have a same thickness.

10. The electronic device module of claim 1, wherein a surface of the shielding frame comprises a coupling layer having a surface roughness increased by a surface treatment.

11. A method of manufacturing an electronic device module, the method comprising:
    forming a heat dissipating portion and posts by removing portions of a metal plate;
    forming a shielding frame by bending portions of the metal plate at which the heat dissipating portion and the posts are connected to each other;
    mounting the shielding frame on a substrate such that a first device mounted on the substrate is accommodated in the shielding frame;
    forming a heat dissipating member on the heat dissipating portion;
    forming a sealing portion by disposing a molding resin on the shielding frame such that the molding resin covers at least a portion of an upper surface of the shielding frame and fills an inside of the shielding frame through a space between the posts of the shielding frame; and
    forming a shielding layer on a surface of the sealing portion,
    wherein the heat dissipating member is in contact with the shielding layer.

12. The method of claim 11, wherein the space between the posts is smaller than a wavelength of an electromagnetic wave introduced into the first device or output from the first device.

13. The method of claim 11, further comprising disposing a heat transfer layer on an upper surface of the first device, prior to mounting the shielding frame on the substrate.

14. The method of claim 11, further comprising, after forming the shielding frame, forming a coupling layer having increased roughness on a surface of the shielding frame.

15. An electronic device module comprising:
    a substrate;
    a first device mounted on the substrate and configured to input and/or output an electromagnetic wave having a certain wavelength;
    a heat dissipating portion configured to dissipate heat generated by the first device; and columns extending between the heat dissipating portion and the substrate to surround a periphery of the first device, wherein the substrate comprises insertion holes, a metal layer disposed on an inner wall of the insertion holes, and a conductive adhesive filled within a space defined by the insertion holes, and wherein each of the columns comprises an insertion portion inserted into a respective insertion hole and electrically connected to the metal layer via the conductive adhesive.

16. The electronic device module of claim 15, wherein the heat dissipating portion is in surface contact with a surface of the first device.

17. The electronic device module of claim 15, further comprising a heat transfer layer disposed between the heat dissipating portion and a surface of the first device.

18. The electronic device module of claim 17, further comprising a heat dissipating member disposed on a surface of the heat dissipating portion opposite a surface of the heat dissipating portion adjacent to the heat transfer layer.

19. The electronic device module of claim 18, further comprising a shielding layer disposed on the heat dissipating member and configured to be electrically connected to a ground pattern of the substrate.

20. The electronic device module of claim 15, wherein the heat dissipating portion is integral with the columns and a thickness of the heat dissipating portion is equal to a thickness of each of the columns.

21. The electronic device module of claim 15, wherein a thickness of the heat dissipating portion is greater than a thickness of each of the columns.

22. The electronic device module of claim 15, wherein a cross-sectional area of each of the insertion portions is smaller than a cross-sectional area of a remainder of each of the columns.

23. The electronic device module of claim 15, wherein a distance between adjacent columns is smaller than the certain wavelength.

24. The electronic device module of claim 15, wherein the heat dissipating portion comprises an accommodating groove having a smaller thickness than other portions of the heat dissipating portion in a surface adjacent to the surface of the first device.

25. The electronic device module of claim 24, wherein the heat transfer layer is disposed in the accommodating groove.

* * * * *